United States Patent
Peng et al.

(10) Patent No.: US 9,635,724 B2
(45) Date of Patent: Apr. 25, 2017

(54) ADAPTIVE STABILITY CONTROL FOR A DRIVER CIRCUIT

(71) Applicant: QUALCOMM Incorporated, San Diego, CA (US)

(72) Inventors: Xinli Peng, Chandler, AZ (US); Sandeep Chaman Dhar, San Diego, CA (US); Troy Stockstad, Chandler, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/883,317

(22) Filed: Oct. 14, 2015

(65) Prior Publication Data

US 2016/0037603 A1 Feb. 4, 2016

Related U.S. Application Data

(63) Continuation of application No. 14/293,489, filed on Jun. 2, 2014, now Pat. No. 9,190,986.

(51) Int. Cl.
*H03G 11/04* (2006.01)
*H05B 33/08* (2006.01)
*H03K 3/01* (2006.01)

(52) U.S. Cl.
CPC .......... *H05B 33/0845* (2013.01); *H03K 3/01* (2013.01); *H05B 33/0809* (2013.01); *H05B 33/0884* (2013.01)

(58) Field of Classification Search
USPC ........ 327/306, 309, 315–316, 318, 331, 332
See application file for complete search history.

(56) References Cited

U.S. PATENT DOCUMENTS

| | | | |
|---|---|---|---|
| 6,876,190 B2 * | 4/2005 | Tai ..................... | G01R 19/0092 324/117 R |
| 7,023,271 B1 | 4/2006 | Aram | |
| 7,466,195 B2 * | 12/2008 | Drogi ................... | H03F 1/0222 330/136 |
| 7,903,058 B1 | 3/2011 | Jacquet et al. | |
| 8,299,767 B1 | 10/2012 | Tuozzolo et al. | |
| 8,471,499 B2 | 6/2013 | Um et al. | |
| 8,669,711 B2 * | 3/2014 | Riesebosch ........ | H05B 33/0827 315/192 |
| 2006/0186870 A1 | 8/2006 | Shami | |
| 2009/0230874 A1 | 9/2009 | Zhao et al. | |

(Continued)

FOREIGN PATENT DOCUMENTS

EP 2704300 A1 3/2014

OTHER PUBLICATIONS

Dixon L., "Control Loop Design", Topic 7 Texas Instruments, Jan. 1, 2001, XP055227920, 10 Pages. Retrieved from the Internet: URL: http://www.ti.com/lit/ml/slup098/slup098.pdf [retrieved on Nov. 12, 2015].

(Continued)

*Primary Examiner* — An Luu
(74) *Attorney, Agent, or Firm* — Haynes and Boone, LLP (57) ABSTRACT

A circuit may include a control loop to regulate an output of the circuit and a headroom sensing circuit to produce a headroom sensing signal indicative of a headroom voltage of the circuit. The control loop may have a response characteristic that is set based on the headroom signal received from the headroom sensing circuit.

17 Claims, 9 Drawing Sheets

(56) References Cited

U.S. PATENT DOCUMENTS

2009/0284235 A1    11/2009  Weng et al.
2012/0081016 A1     4/2012  Wu et al.
2012/0126712 A1     5/2012  Kim
2012/0127214 A1     5/2012  Han et al.
2012/0133293 A1     5/2012  Shin
2012/0268013 A1    10/2012  Riesebosch
2013/0027134 A1     1/2013  Zhu
2013/0257279 A1    10/2013  Le
2014/0035628 A1     2/2014  Oaklander

OTHER PUBLICATIONS

International Search Report and Written Opinion—PCT/US2015/031381—ISA/EPO—Nov. 24, 2015.
Related U.S. Appl. No. 14/293,489, Xinli Peng et al, entitled "Adaptive Stability Control for a Driver Circuit", filed Jun. 2, 2014.

* cited by examiner

ADAPTIVE STABILITY CONTROL FOR A DRIVER CIRCUIT

CROSS REFERENCE TO RELATED APPLICATIONS

This application is a continuation application and pursuant to 35 U.S.C. §120 is entitled to and claims the benefit of earlier filed application U.S. application Ser. No. 14/293,489 filed Jun. 2, 2014, the content of which is incorporated herein by reference in its entirety for all purposes.

BACKGROUND

Unless otherwise indicated, the foregoing is not admitted to be prior art to the claims recited herein and should not be construed as such.

With the integration of high resolution cameras into mobile devices such as smart phones and computing tablets, high current (e.g., >1 A) flash LEDs are typically required for high pixel (e.g., >5M pixel) cameras. Thus, the power dissipation in power management ICs (PMICs) that include flash LED drivers is elevated. Since the flash LED driver is one of the higher power consumption modules in a PMIC, minimizing the power dissipation from the flash LED driver is an important consideration in a PMIC design to extend battery life and reduce thermal risks.

Typically, a flash LED driver includes an output stage and a current regulator that regulates the output current of the output stage. The current regulator may include an error amplifier that is connected to the output stage in a feedback loop.

Power dissipation can be reduced by reducing the headroom voltage of the flash LED driver. Headroom voltage refers to the voltage drop between the driver's voltage supply and the output voltage of the driver. However, when the headroom voltage is decreased, the feedback loop tends to drive the output stage into the linear region, thus reducing the system loop gain. Conversely, when the headroom voltage is increased, the output stage is driven into the saturation region with much larger gain (e.g., 50-60 dB or higher), which reduces phase margin and thus system stability.

Further exacerbating the problem is that conventional PMIC designs cannot anticipate what devices (smart phones, computer tablets, portable cameras, etc.) the PMICs will be used in, and how such devices will be used by the end user. Accordingly, a given PMIC can be exposed to a wide range of headroom voltage conditions and load conditions and so its design is not likely to be adequate for all use cases.

SUMMARY

In accordance with various aspects of the present disclosure, a circuit may include a control loop to regulate an output of the circuit. The circuit may include a headroom sensing circuit to produce a headroom sensing signal indicative of the headroom voltage of the circuit. The control loop may have a response characteristic that is set based on the headroom signal received from the headroom sensing circuit.

In some aspects, the headroom signal may set a gain of the response characteristic of the control loop, or a bandwidth of the response characteristic. The headroom signal may set a pole position of the frequency response curve; for example, a dominant pole position.

In some aspects, the control loop may include circuit elements that determine the response characteristic of the control loop. The headroom signal may vary at least one of the circuit elements to vary the response characteristic of the control loop.

In some aspects, the circuit may include a load sensing circuit to produce a load signal representative of an electrical loading on the circuit. The response characteristic may further be based on the load signal. In some aspects, the load signal may set the zero position of a zero of a frequency response curve. The load signal may be representative of the current into an external load of the circuit.

In some aspects, the headroom signal may be based on an input voltage supplied to the circuit and an output voltage produced by the circuit.

In some aspects according to the present disclosure, a method in a circuit may include regulating an output of a circuit to drive a load connected to the circuit, producing a headroom signal indicative of a headroom voltage of the circuit, and setting a response characteristic of a control loop used to regulate the output of the circuit based on the headroom signal.

In some aspects, setting the response characteristic of the control loop may include setting a gain or a bandwidth of the control loop. In some aspects, setting the response characteristic of the control loop may include setting a dominant pole position of frequency response of the control loop.

In some aspects, setting the response characteristic of the control loop may include adjusting one or more circuit elements that comprise the control loop.

In some aspects, the method may further include producing a load signal representative of an electrical loading on the circuit and setting the response characteristic of the control loop based on the load signal in addition to the headroom signal.

In some aspects, the headroom signal may be based on an input voltage supplied to the circuit and an output voltage produced by the circuit.

In some aspects according to the present disclosure, a circuit may include means for regulating an output of a circuit (first means) to drive a load connected to the circuit, the means for regulating having a response characteristic; means for producing a headroom signal indicative of a headroom voltage of the circuit (second means); and means for setting the response characteristic of the first means using the headroom signal produced by the second means.

In some aspects, the means for setting may include one or more circuit components that comprise the first means, wherein headroom signal can vary the one or more circuit components to set the response characteristic.

In some aspects, the headroom signal may be based on an input voltage supplied to the circuit and an output voltage produced by the circuit.

In some aspects, the circuit may further include means for producing a load signal representative of an electrical loading on the circuit. The means for setting the response characteristic of the first means may use the load signal in addition to the headroom signal.

The following detailed description and accompanying drawings provide a better understanding of the nature and advantages of the present disclosure.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, make apparent to those of skill in the art how embodiments in accordance with the present disclosure may be practiced. In the accompanying drawings.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Figure 1:
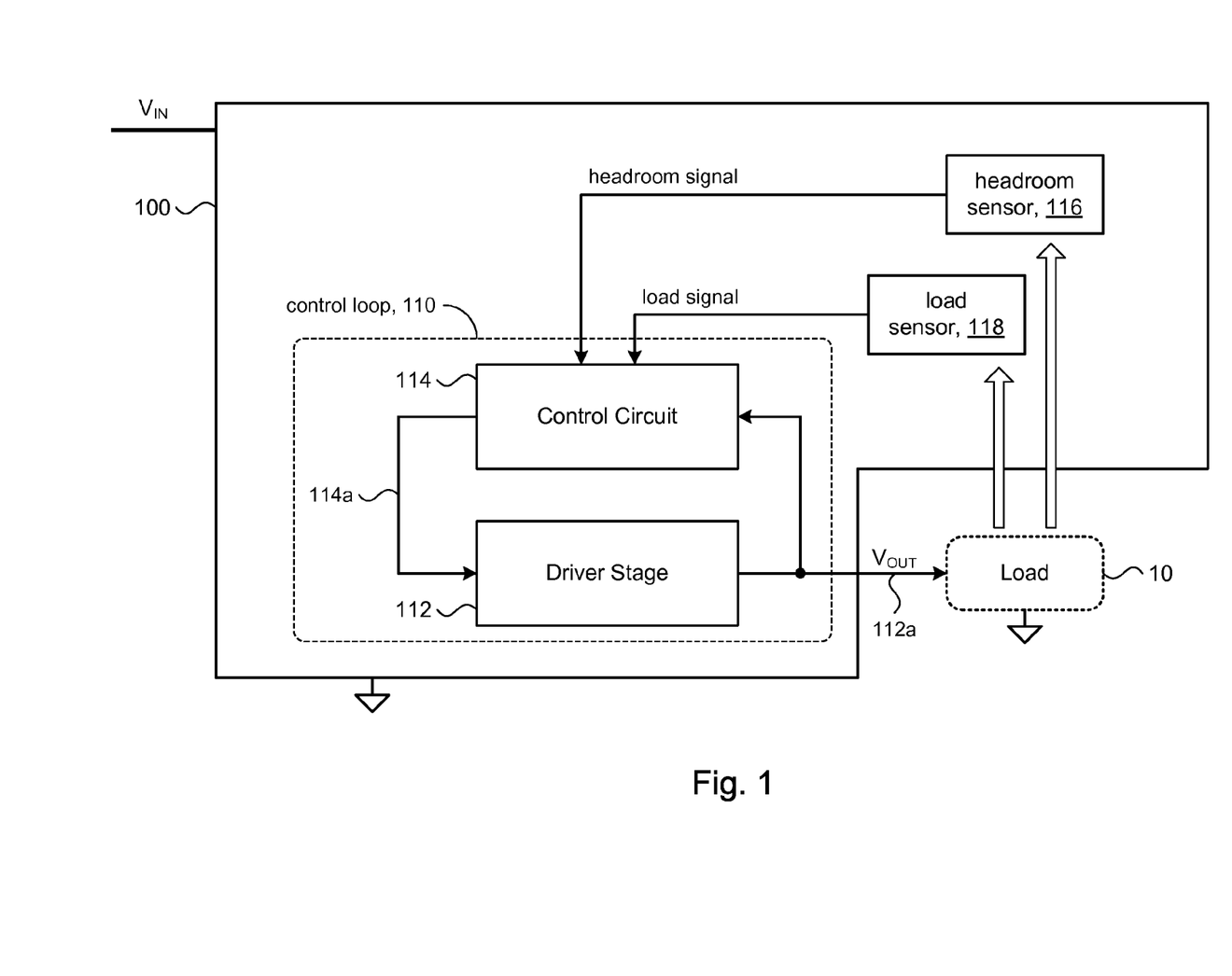
FIG. 1 shows an example of a high level block diagram of a circuit in accordance with the present disclosure.

FIG. 1 shows a circuit 100 in accordance with the present disclosure. In some embodiments, the circuit 100 may comprise a driver stage 112 having a drive output 112a that can be connected to drive a load 10. In general, the load 10 may be any kind of a load. In some embodiments, the load 10 may be an LED flash component of a camera; e.g., a digital camera or a camera in a portable computing device such as a computer tablet, a smartphone, and so on.

A control circuit 114 may provide a control signal 114a that can be used to control operation of the driver stage 112. In some embodiments, the control circuit 114 may be configured with the driver stage 112 as a feedback control loop 110, with the driver output 112a feeding back to an input (e.g., $1^{st}$ input) of the control circuit.

In accordance with present disclosure, a response characteristic of the control loop 110 may be set or otherwise altered in accordance with a signal indicative of the headroom voltage of the circuit 100 during operation when the circuit is driving the load 10. Headroom voltage ("headroom") refers to the voltage drop between the driver's voltage supply (e.g., $V_{IN}$) and the output voltage (e.g., $V_{OUT}$) of the driver 112; e.g., $V_{IN}-V_{OUT}$. Accordingly, circuit 100 may include a headroom sensing circuit 116 that senses a headroom of the circuit. The headroom sensing circuit 116 may produce a headroom signal that is indicative of or otherwise representative of the headroom voltage of circuit 100. The headroom signal can be provided to another input (e.g., $2^{nd}$ input) of the control circuit 114 to affect the response characteristic of the control loop 110. This aspect of the present disclosure will be discussed in more detail below.

In some embodiments, the response characteristic of the control loop 110 may be further set or otherwise altered in accordance with a signal indicative of electrical loading on the circuit 100 due to load 10 during operation; e.g., electrical loading may be represented by the current flowing through the load. Accordingly, circuit 100 may include a load sensing circuit 118 that can generate a load signal indicative of or otherwise representative of the electrical loading on the circuit. The load signal can be provided to another input (e.g., $3^{rd}$ input) of the control circuit 114 to affect the response characteristic of the control loop 110. This aspect of the present disclosure will be discussed in more detail below.

Figure 2:
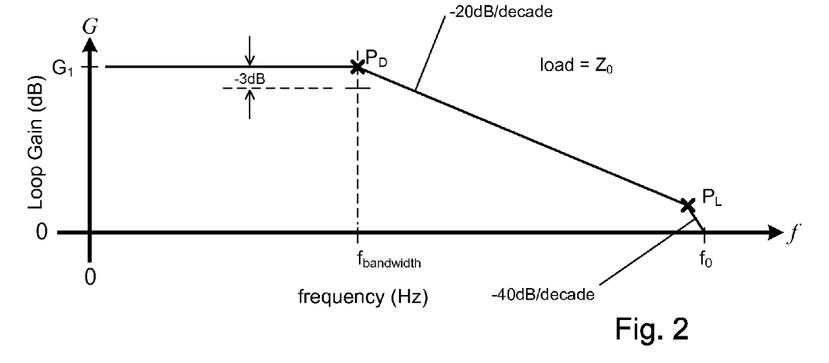
FIGS. 2, 2A, and 2B illustrate frequency response curves.

Referring to FIG. 2, the response characteristic of the control loop 110 (FIG. 1) may be represented by a frequency response curve 200 (e.g., a Bode plot). The response characteristic of the control loop 110 may be characterized by a gain (sometimes referred to as the closed loop gain) that varies with frequency, as illustrated in the frequency response curve 200. The response characteristic of the control loop 110 may be further characterized by a bandwidth ($f_{bandwidth}$), which is conventionally defined as the frequency at which the closed loop gain falls by −3 dB. As will be appreciated by those of ordinary skill, the plot shown in FIG. 2 is a straight-line plot of the actual response characteristic, which is continuous and has a 3 dB drop-off at the pole position $P_D$.

The frequency response curve 200 shown in FIG. 2 represents poles $P_D$, $P_L$ of the response characteristic of the control loop 110. It will be appreciated, that in general, the response characteristic of control loop 110 may include any number and combination of poles and zeroes. For example, the response characteristic of control loop 110 may be expressed as a transfer function represented by the following Laplace transform:

$$H(s) = G \prod \frac{(s - x_n)^{a_n}}{(s - y_n)^{b_n}},$$

where
  H(s) is the transfer function,
  G is the closed loop gain,
  $x_n$ and $y_n$ are constants,
  s is the complex frequency jw, and
  $a_n$ and $b_n$ are >0.
A pole exists for every value of s where $\omega=y_n$ and similarly a zero exists for every s where $\omega=x_n$. The disclosed embodiments describe the behavior of the response characteristic at poles $P_D$ and $P_L$, and at a zero relating to pole $P_L$. However, it will be appreciated from the teachings set forth in the present disclosure that embodiments in accordance with the present disclosure need not be restricted to the poles and zeroes specifically disclosed in the present disclosure, and that other embodiments may involve other poles and/or zeroes of the response characteristic of the control loop 110.

The lowest frequency pole $P_D$ is sometimes referred to as the "dominant pole" because it dominates the effect of any higher frequency poles. As noted above, the dominant pole typically defines the bandwidth of the response characteristic of the control loop 110.

The load 10 that is driven by the driver stage 112 (FIG. 1) can affect the response characteristic of the control loop 110. The load 10 introduces an external pole $P_L$ to the frequency response curve of the control loop 110. The location or position of external pole $P_L$ depends on the size of the load 10 (e.g., expressed as an impedance Z). This effect is illustrated in FIGS. 2, 2A, and 2B for different sized loads.

Figure 2A:
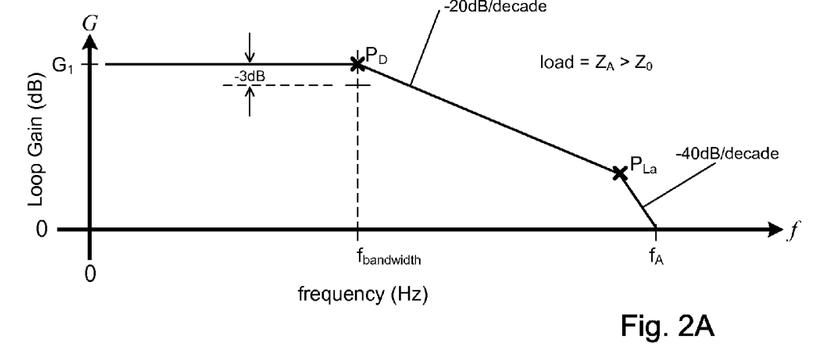
Figure 2B:
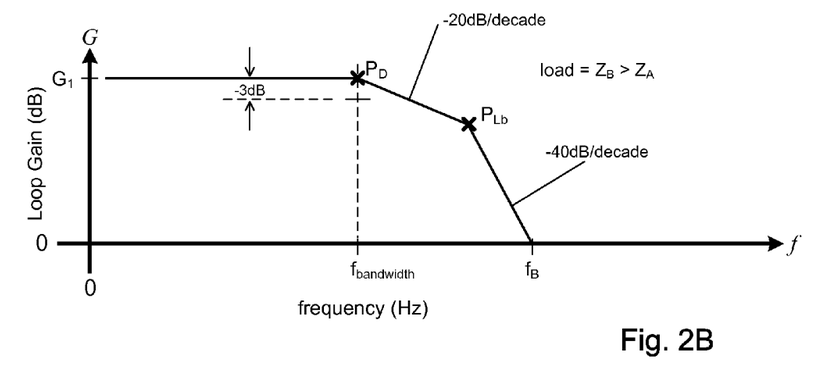

FIGS. 2, 2A, and 2B further illustrate that as the size of the load 10 increases (e.g., increasing impedance Z), the external pole $P_L$ moves closer to the dominant pole $P_D$. Generally, each non-dominant pole closer than a decade away from the unity gain bandwidth of the feedback loop will reduce phase margin, which can ultimately degrade the control loop stability. If the external pole $P_L$ is sufficiently separated from the dominant pole $P_D$, the effect of the external pole on stable operation of the control loop 110 can be small; e.g., the location of external pole $P_L$ in FIG. 2 may be sufficiently far away from dominant pole $P_D$ so that the control loop 110 will be stable. However, in FIG. 2B, the external pole $P_{Lb}$ may be close enough to the dominant pole $P_D$ that the phase margin is so small that unstable operation can result.

Figure 3:
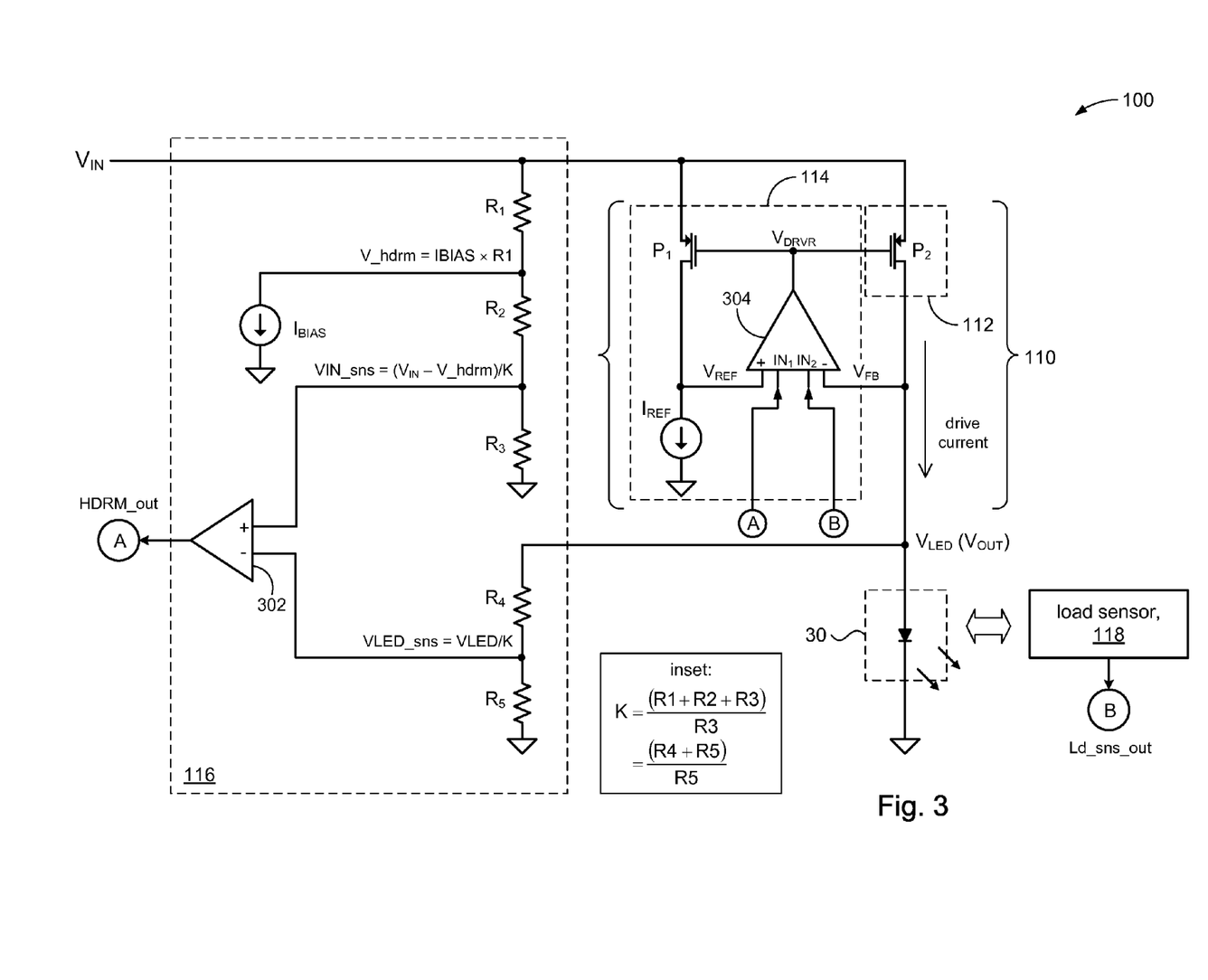
FIG. 3 shows an illustrative embodiment in accordance with the present disclosure.

Referring to FIG. 3, in a particular embodiment, the load may be an LED flash unit 30, such as might be found in digital cameras, portable computing devices, smart phones, etc. The driver stage 112 may comprise a transistor $P_2$, such as a power MOSFET for example. The transistor $P_2$ may provide a drive current from the supply voltage $V_{IN}$ to the LED flash unit 30.

The control circuit 114 may comprise an OP amp 304 and a constant current source $I_{REF}$. The control circuit 114 may further include a current mirror, comprising a transistor $P_1$ and the driver stage transistor $P_2$, that is driven by the output $V_{DRVR}$ of OP amp 304.

The driver stage 112 and control circuit 114 may constitute the control loop 110. The OP amp 304 in control circuit 114 may control the driver stage transistor $P_2$ in a feedback loop by regulating the drive current (provided as feedback voltage $V_{FB}$) based on a reference provided by the constant current source $I_{REF}$ (provided as $V_{REF}$). In some embodiments, the constant current source $I_{REF}$ may be a small current source (e.g., 10 µA). Accordingly, the device dimensions of $P_1$ and $P_2$ in the current mirror may be designed to provide a suitable $P_1/P_2$ current ratio in order to provide a suitable drive current to operate the LED flash unit 30. In an embodiment, for example, the $P_1/P_2$ current ratio may be 1:10,000, giving a current gain of 10,000 at $P_2$. It will be appreciated of course that in other embodiments, $P_1$ and $P_2$ can be designed to provide any suitable current gain.

As mentioned above, the headroom sensing circuit 116 may generate a headroom signal indicative of or otherwise representative of the headroom voltage of the circuit 100. In some embodiments, the headroom sensing circuit 116 may comprise a comparator 302 to compare the driver stage output voltage $V_{OUT}$ provided to the load (e.g., LED flash unit 30) against the supply voltage (e.g., $V_{IN}$). The headroom signal HDRM_out produced by the headroom sensing circuit 116 is thus representative of the headroom voltage of the circuit 100 and may feed into the control circuit 114. In some embodiments, HDRM_out feeds into a control input $IN_1$ of the OP amp 304 of control circuit 114.

In some embodiments, resistor divider networks may be used to reduce the voltage levels that feed into comparator 302. For example, the output voltage $V_{OUT}$ on the load 30 may be divided down by the resistor divider comprising $R_4$ and $R_5$. The supply voltage $V_{IN}$ can be divided down in similar fashion as described below.

The headroom sensing circuit 116 may include a programmable current source $I_{BIAS}$. The headroom sensing circuit 116 may include a resistor $R_1$ to drop the supply voltage $V_{IN}$ by an amount, V_hdrm, that is determined by the current source $I_{BIAS}$ and resistor $R_1$ (e.g., V_hdrm=$I_{BIAS}$× $R_1$). Headroom detection may then be determined based on the reduced supply voltage level, namely ($V_{IN}$−V_hdrm).

The voltage level V_hdrm can be viewed as defining a headroom voltage threshold. Resistors $R_2$ and $R_3$ then divide down the headroom voltage threshold. The inset in FIG. 3 defines the constant K, which in a particular embodiment also sets forth a relationship among the resistance values of resistors $R_1$-$R_5$.

As noted above, the load that is being driven by the driver stage 112 can change, depending what the load is, how it is being used, etc.; for example, an LED flash device 30 can operate in different modes; e.g., flash, strobe, etc. As will be explained below, the size of the load can affect the response characteristic of the control loop 110. In some embodiments, the load sensing circuit 118 may produce a signal Ld_sns_out that represents the drive current from the driver stage 112 that can feed into the control circuit 114. In some embodiments, the Ld_sns_out signal feeds into a control input $IN_2$ of the OP amp 304 of control circuit 114.

Figure 3A:
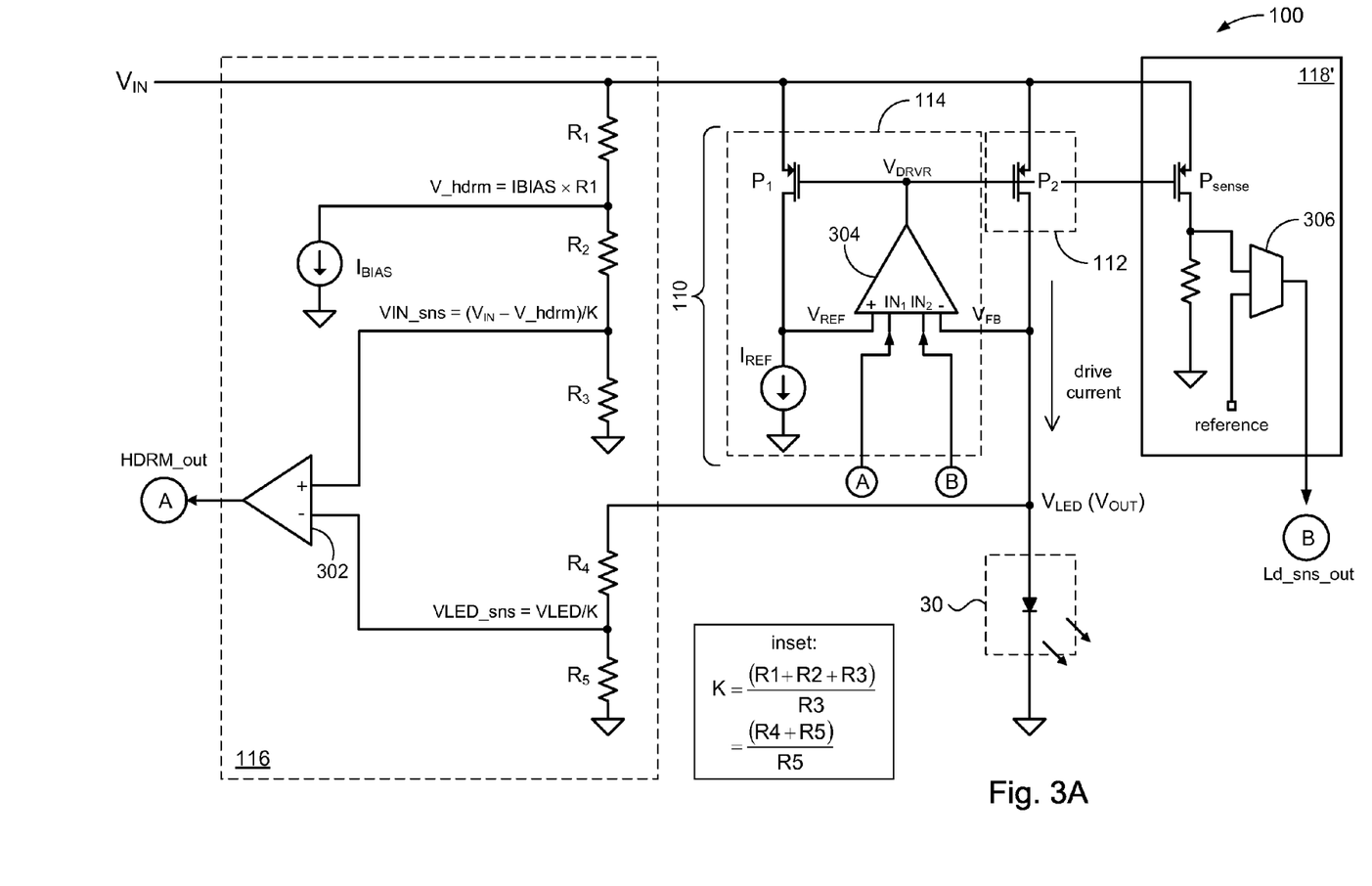
FIG. 3A shows some details for a load sensor.

As an example, in some embodiments, the load sensing circuit 118 may comprise a current sensor. Referring to FIG. 3A, for example, load sensing circuit 118' may comprise a mirrored sense transistor $P_{sense}$ that mirrors the current flow through the driver stage transistor $P_2$. A comparator 306 may compare the current flow through $P_{sense}$ against a reference and output a signal Ld_sns_out that represents the level of the drive current flowing into the load 30. In other embodiments, the load sensing circuit 118 may be load current programming circuit (not shown) that programs the load current, and the Ld_sns_out signal may be based on a parameter (e.g., stored in a programming register) used to program the load current.

In accordance with the present disclosure, the response characteristic of the control loop 110 can be set based on the headroom signal HDRM_out, or the load signal Ld_sns_out, or both. For example, the HDRM_out signal may be used to set the gain of the response characteristic, or the bandwidth of the response characteristic, or both. Similarly, the Ld_sns_out signal may be used to set the position of a zero of the response characteristic. As will be discussed below, this can improve stability in the control loop 110 as changes in the headroom voltage and loading conditions (e.g., current load) occur during operation of circuit 100.

Figure 4:
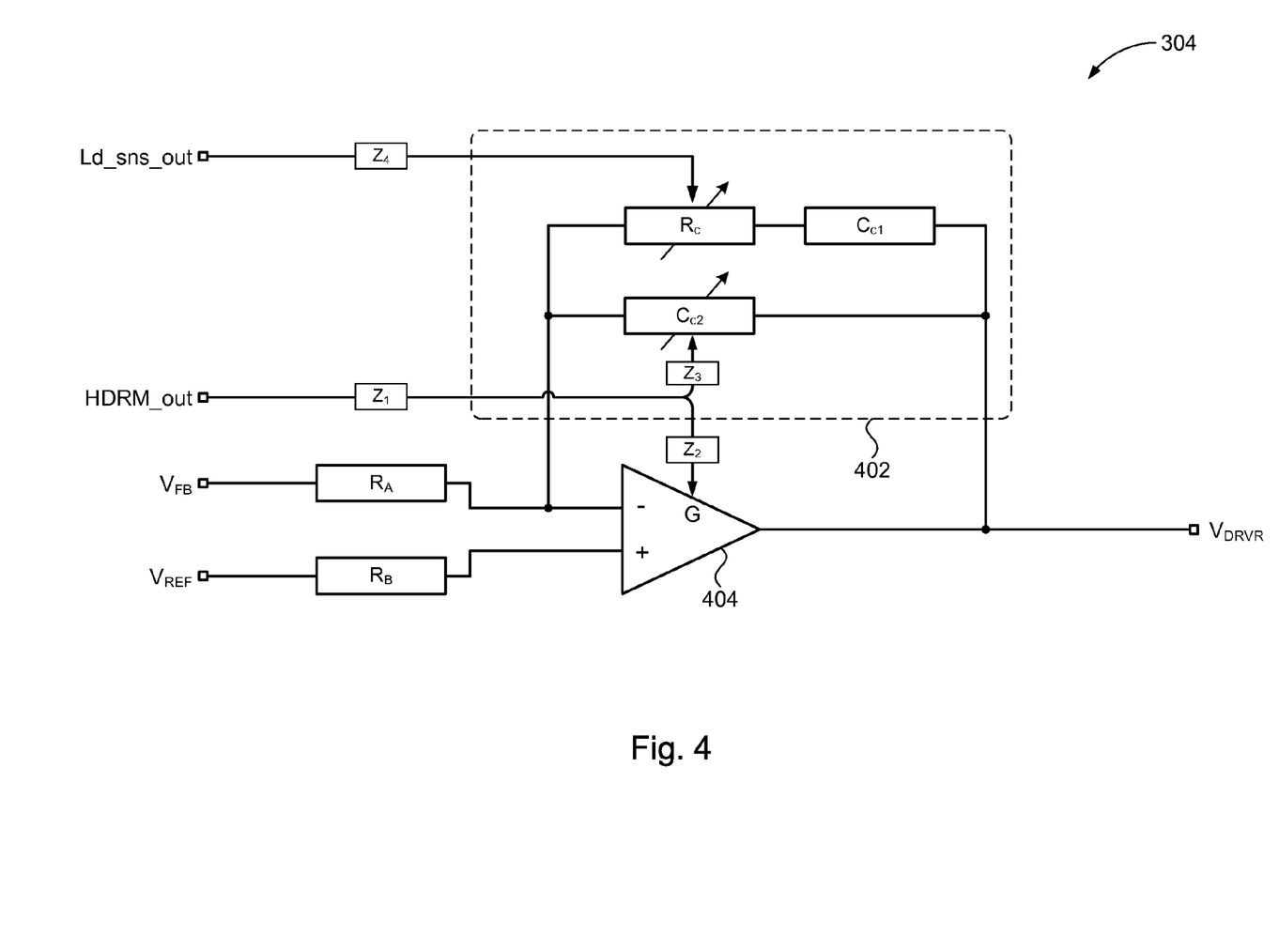
FIG. 4 shows some details for an illustrative embodiment of OP amp 304.

Referring now to FIG. 4, additional detail of OP amp 304 illustrates how the HDRM_out and Ld_sns_out signals may be used to set the response characteristic of control loop 110. In some embodiments, for example, the response characteristic of the control loop 110 may be set by setting circuit elements in the OP amp 304.

The OP amp 304 may comprise an opamp device 404 having an inverting input and a non-inverting input. The reference voltage $V_{REF}$ may be connected to the non-inverting input through resistor $R_B$. The feedback voltage $V_{FB}$ may be connected to the inverting input through resistor $R_A$. The opamp device 404 may include a gain control input G that varies the gain of the opamp device. The HDRM_out signal may be coupled directly to or otherwise connected to the gain control input G, thereby allowing the HDRM_out signal to control the gain of the opamp device 404. Accordingly, circuit element $Z_1$ may represent a wire for a direct connection of the HDRM_out signal to the gain control input G, or $Z_1$ may represent some intervening electronic circuitry that can provide gain control as some function of the HDRM_out signal. Similarly, circuit element $Z_2$ may represent a wire or some appropriate intervening electronic circuitry.

The OP amp 304 may include a compensation network 402 of any suitable design. In some embodiments, the response characteristic (e.g., transfer function H(s)) of the control loop 110 may be expressed in terms of the circuit elements comprising the compensation network. In accordance with the present disclosure, the compensation network 402 may comprise one or more circuit elements that can be adjusted or otherwise varied using the HDRM_out signal and/or the Ld_sns_out signal in order to vary the response characteristic of control loop 110.

Merely as an illustration of principles of the present disclosure, consider the compensation network shown in FIG. 4. The compensation network 402 may comprise a resistor element $R_C$ connected in series with a capacitor element $C_{C1}$, and a shunt capacitor $C_{C2}$ connected in parallel with the $R_C/C_{C1}$ pair. The resistor element $R_C$ may provide a selectable resistance. Setting the resistance value of resistor $R_C$ can set the position of a zero in the response characteristic of control loop 110. Similarly, the capacitor $C_{C2}$ may provide a selectable capacitance. Setting the capacitance value of capacitor $C_{C2}$ can set the position of the dominant pole in the response characteristic of control loop 110.

In accordance with the present disclosure, the HDRM_out signal may be coupled directly to or otherwise connected to a selector input of the variable capacitor $C_{C2}$. As explained above, circuit element $Z_1$ may represent a wire or some appropriate intervening electronic circuitry and likewise, circuit element $Z_3$ may represent a wire or some intervening electronic circuitry. Accordingly, the HDRM_out signal may be used to set the dominant pole position of the response characteristic of control loop 110.

Further in accordance with the present disclosure, Ld_sns_out signal may be coupled directly or otherwise connected to a selector input of the variable resistor $R_C$. Circuit element $Z_4$ may represent a wire for a direct connection of the Ld_sns_out signal to the selector input of the variable resistor $R_C$, or $Z_4$ may represent some intervening electronic circuitry that can set resistor $R_C$ as some function of the Ld_sns_out signal. Accordingly, the Ld_sns_out signal may be used to set a zero position of the response characteristic of control loop 110.

Figure 4A:
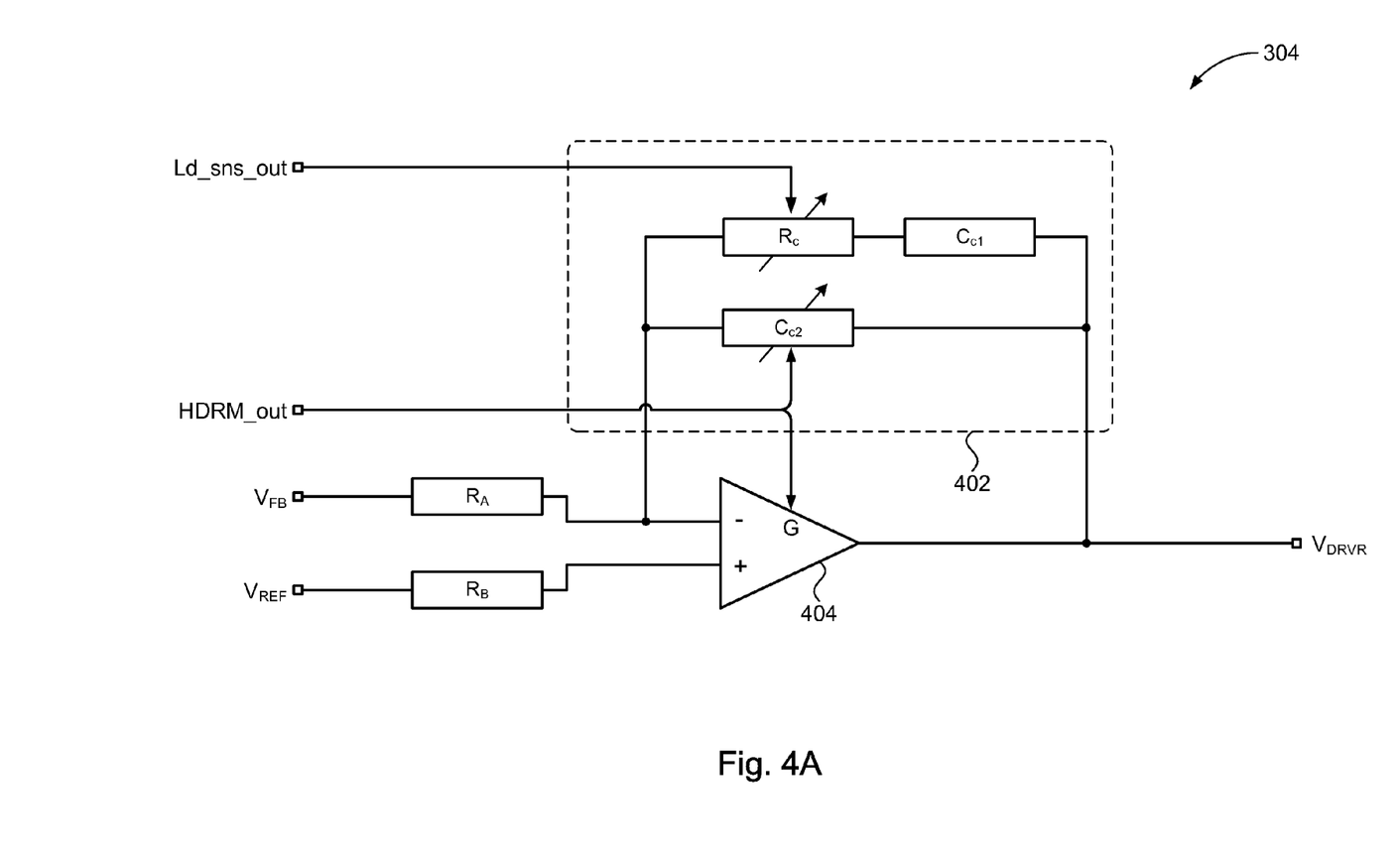
FIG. 4A shows an alternative embodiment of FIG. 4.

In some embodiments circuit elements $Z_1$-$Z_4$ are wires representing straight through connections, such as illustrated for example in FIG. 4A.

Figure 5A:
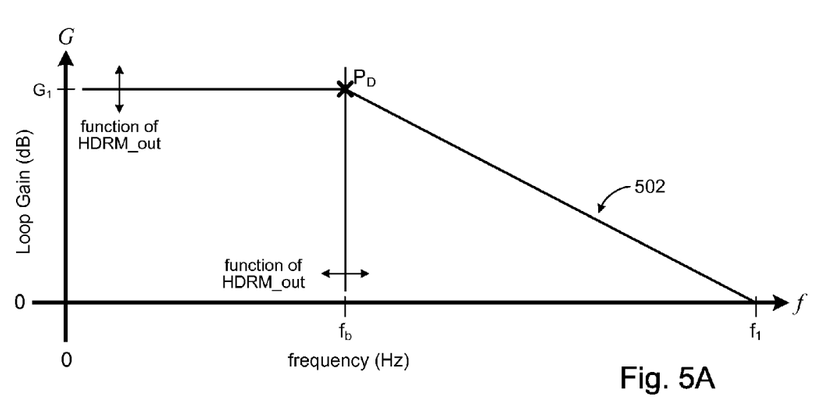
FIGS. 5A-5D illustrate frequency response curves that characterize aspects of the present disclosure.

Referring to FIGS. 5A-5D, frequency response curves 502-508 can be used to illustrate the effects on the response characteristic of control loop 110 when the headroom signal HDRM_out is applied in accordance with the present disclosure. Suppose the frequency response curve 502 in FIG. 5A represents a response characteristic of control loop 110 having a gain G1 and bandwidth $f_b$ as determined by the dominant pole $P_D$. FIG. 5A illustrates that the headroom signal HDRM_out can vary the gain and/or the dominant pole position (and hence the bandwidth) of the response characteristic.

Figure 5B:
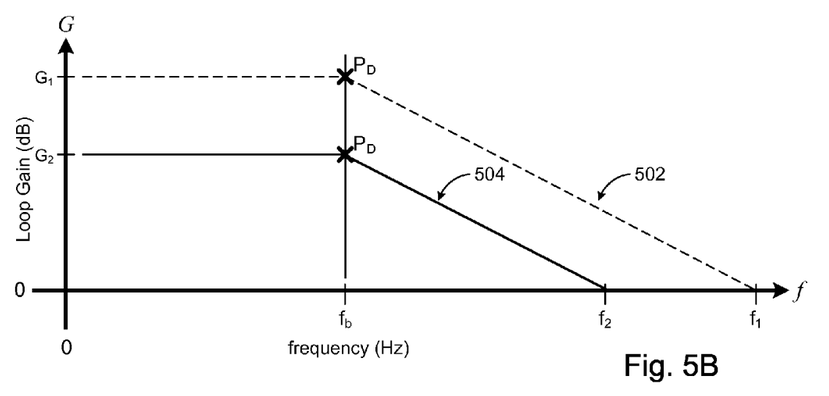

FIG. 5B, shows how the frequency response curve 504 changes if just the gain is varied, for example, if the gain is reduced to $G_2 < G_1$. Thus, in accordance with some embodiments of the present disclosure, when the headroom voltage exceeds a threshold voltage (e.g., V_hdrm in FIG. 3), the HDRM_out signal can be used to reduce the gain in order to improve stability in the control loop 110. Referring for a moment to FIG. 4, the HDRM_out signal can control the gain of the opamp device 404 to vary the gain of the frequency response curve. Reducing the gain brings the unity gain bandwidth of the control loop 110 back from frequency $f_1$ to frequency $f_2$. This improves stability if non-dominant poles exist within a decade or closer to $f_1$.

Figure 5C:
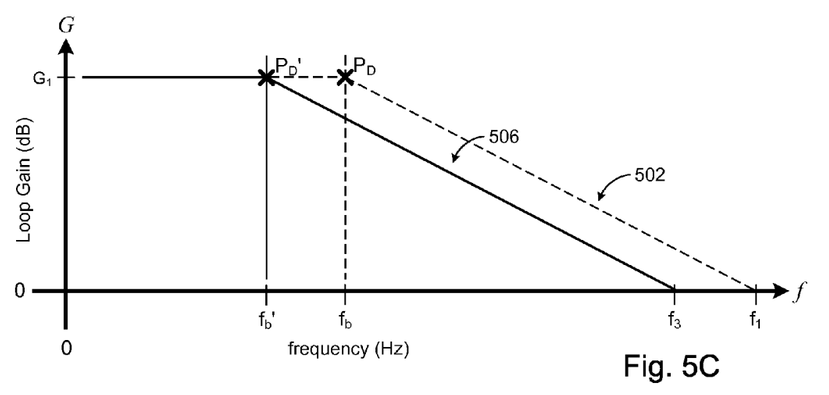

FIG. 5C shows how the frequency response curve 506 changes if just the dominant pole is varied, for example, from $f_b$ to $f_b' < f_b$. Since the dominant pole determines the bandwidth, varying the dominant pole (e.g., $P_D$ to $P_D'$) has the effect of varying the bandwidth of the response characteristic. Thus, in accordance with some embodiments of the present disclosure, when the headroom voltage exceeds the threshold voltage, the HDRM_out signal can be used to reduce the bandwidth in order to improve stability in the control loop 110. Conversely, when the headroom voltage falls below the threshold voltage, the HDRM_out signal can be used to increase the bandwidth to improve the response time of the control loop 110. Referring again to FIG. 4, the HDRM_out signal can control the value of the variable capacitor $C_2$ to vary the dominant pole position of the frequency response curve.

Figure 5D:
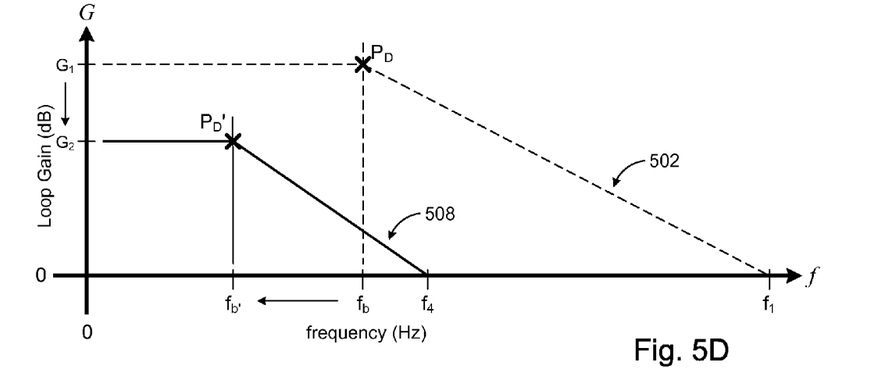

Referring to FIG. 5D, in some embodiments, the HDRM_out signal may control both the gain and the dominant pole position (i.e., bandwidth) of the response characteristic of control loop 110. The frequency response curve 508 shown in FIG. 5D illustrates an example in which the gain and bandwidth are reduced. Thus, in accordance with some embodiments of the present disclosure, when the headroom voltage exceeds the threshold voltage, the HDRM_out signal can be used to reduce both the gain and the bandwidth of the response characteristic in order to improve stability in the control loop 110. Conversely, when the headroom voltage falls below the threshold voltage, the HDRM_out signal can be used to increase the gain and bandwidth to improve the response time of the control loop 110.

In some embodiments, the gain and bandwidth may change together, as HDRM_out changes. In other embodiments, the gain and bandwidth may be varied independently of each other. For example, circuit elements $Z_1$-$Z_3$ (FIG. 4) may be suitable control circuitry to isolate the HDRM_out signal from the gain control input and capacitor $C_{C2}$ for independent operation.

Figure 6A:
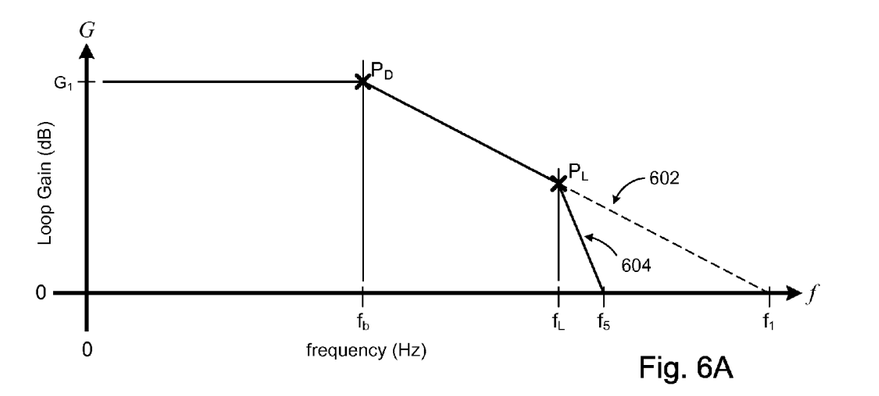
FIGS. 6A-6D illustrate frequency response curves that characterize further aspects of the present disclosure.
Figure 6B:
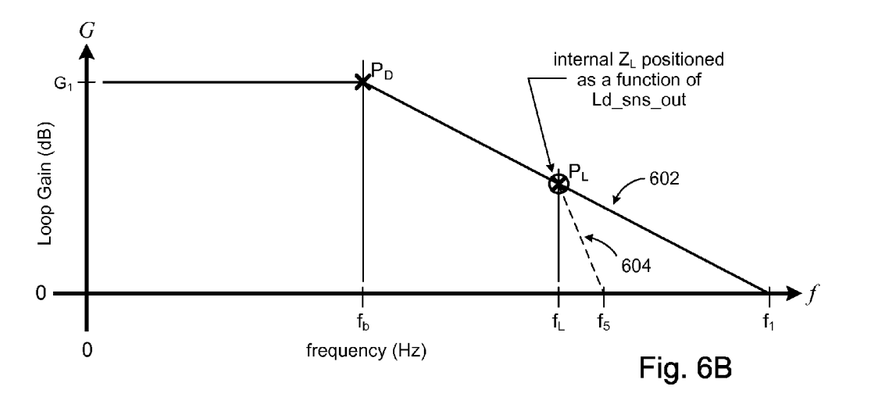

Referring to FIGS. 6A and 6B, frequency response curves 602, 604 can be used to illustrate the effects on the response characteristic of control loop 110 when the load signal Ld_sns_out is applied in accordance with the present disclosure. As explained above, the load 10 (e.g., LED flash unit 30, FIG. 3) introduces an external pole that can affect the response characteristic of the control loop 110. Consider the illustration in FIG. 6A, for example. Suppose the response characteristic of the control loop 110 without a load is represented by the frequency response curve 602. When a load is added, an external pole $P_L$ due to the load may be introduced, which may result in frequency response curve 604. The additional drop off occurring a frequency $f_L$ reduces stability of the control loop 110 due to a decrease in phase margin.

However, in accordance with the present disclosure, the Ld_sns_out signal may be used to set a zero position of an internal zero in the control loop 110 to compensate for the external pole $P_L$. Referring for a moment to FIG. 4, the Ld_sns_out signal can control the value of variable resistor $R_C$ to vary an internal zero of the response characteristic. This effect is illustrated in FIG. 6B, where the Ld_sns_out signal can set the zero position of an internal zero $Z_L$ to cancel the effect of the external pole $P_L$ and eliminate the drop off at frequency $f_L$ to improve stability.

Figure 6C:
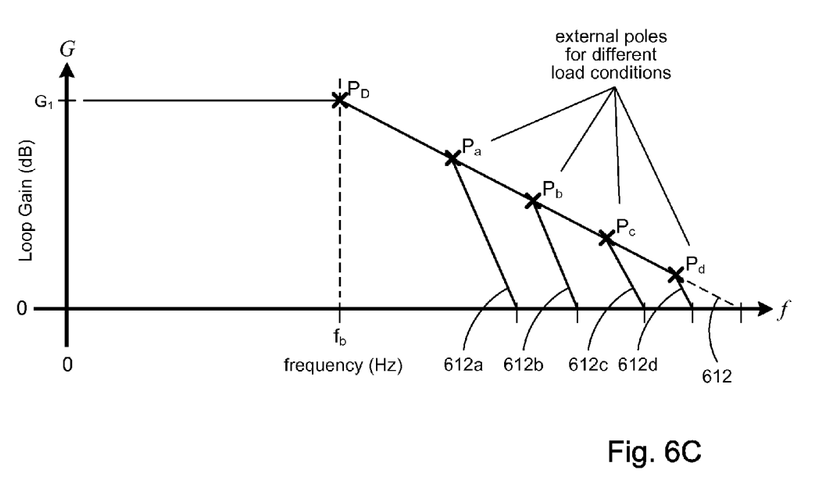

As the load changes, so will the pole position of the external pole, as illustrated in FIG. 6C. For example, in one situation the load may be such as to introduce external pole $P_a$ to the response characteristic; in another situation, the load may be such as to introduce a different external pole, e.g., $P_b$, to the response characteristic, and so on. Each time the external pole changes, the response characteristic of the control loop 110 changes. The stability of the control loop 110 can therefore vary according to the load, as illustrated by the frequency response curves, 612a, 612, b, 612c, 612d. As one can appreciate, designing a control circuit 114 (FIG. 1) to maintain stability under any load condition can be challenging, since the designer has no control over what load the circuit 100 will be connected to or how the load may change during operation.

Figure 6D:
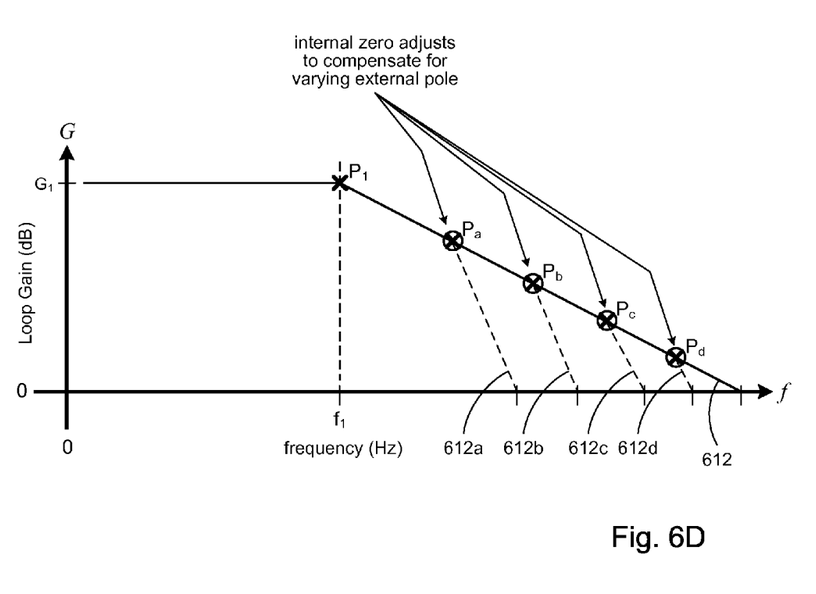

In accordance with the present disclosure, the load sensor 118 can produce a Ld_sns_out signal that is representative of or otherwise tracks the load. The Ld_sns_out signal can be used to adjust an internal zero of the control loop 110 (e.g., via variable resistor $R_C$) to compensate for varying external poles resulting from varying loads, and thus improve stability in the control loop 110 as represented by the frequency response curve 612. This effect is illustrated in FIG. 6D, which illustrates that the internal zero can vary to track the external pole as the load varies.

Advantages and Technical Effect

Aspects of circuits in accordance with the present disclosure allow for automatic adjustment of the loop gain and/or dominant pole position of the control loop based on voltage headroom during operation, when a load is being driven.

Another aspect of circuits in accordance with the present disclosure allow for automatically varying the zero position of an internal zero of the control loop based on load condition of the load being driven by the circuit.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

We claim the following:

1. A circuit comprising:
   a control loop configured to regulate an output of the circuit; and
   a headroom sensing circuit configured to produce a headroom sensing signal indicative of a headroom voltage of the circuit,
   wherein:
      the control loop is electrically connected to the headroom sensing circuit to receive the headroom signal,
      the control loop having a response characteristic that is set based on the headroom signal received from the headroom sensing circuit, and
      the control loop comprises a plurality of circuit elements that determine the response characteristic of the control loop, wherein the headroom signal varies at least one of the circuit elements to vary the response characteristic of the control loop.

2. The circuit of claim 1, wherein the received headroom signal sets a gain of the response characteristic of the control loop.

3. The circuit of claim 1, wherein the received headroom signal sets a bandwidth of the response characteristic.

4. The circuit of claim 1, wherein the received headroom signal sets a pole position of a frequency response curve representative of the response characteristic of the control loop.

5. The circuit of claim 4, wherein the received headroom signal sets a dominant pole position of a frequency response curve representative of the response characteristic of the control loop.

6. The circuit of claim 1, further comprising a load sensing circuit configured to produce a load signal representative of an electrical loading on the circuit, the control loop further having an electrical connection to the load sensing circuit to receive the load signal, wherein the response characteristic of the control loop is further set based on the load signal received from the load sensing circuit.

7. The circuit of claim 6, wherein the received load signal sets a zero position of a zero of a frequency response curve representative of the response characteristic of the control loop.

8. The circuit of claim 6, wherein the load signal is representative of a current flow to an external load connected to the circuit.

9. The circuit of claim 1, wherein the headroom sensing circuit is configured to produce the headroom signal based on an input voltage supplied to the circuit and an output voltage produced by the circuit.

10. A method comprising:
    regulating an output of a circuit to drive a load connected to the circuit;
    producing a headroom signal indicative of a headroom voltage of the circuit; and
    setting a response characteristic of a control loop used to regulate the output of the circuit based on the headroom signal that is indicative of the headroom voltage of the circuit, wherein setting the response characteristic of the control loop includes adjusting one or more circuit elements that comprise the control loop.

11. The method of claim 10, wherein setting the response characteristic of the control loop includes setting a gain or a bandwidth of the control loop.

12. The method of claim 10, wherein setting the response characteristic of the control loop includes setting a dominant pole position of frequency response of the control loop.

13. The method of claim 10, further comprising producing a load signal representative of an electrical loading on the circuit and setting the response characteristic of the control loop based on the load signal in addition to the headroom signal.

14. The method of claim 10, wherein the headroom signal is based on an input voltage supplied to the circuit and an output voltage produced by the circuit.

15. A circuit comprising:
    means for regulating an output of a circuit (first means) to drive a load connected to the circuit, the means for regulating having a response characteristic;
    means for producing a headroom signal indicative of a headroom voltage of the circuit (second means); and
    means for setting the response characteristic of the first means using the headroom signal produced by the second means, wherein the means for setting includes one or more circuit components that comprise the first means, wherein headroom signal can vary the one or more circuit components to set the response characteristic.

16. The circuit of claim 15, wherein the headroom signal is based on an input voltage supplied to the circuit and an output voltage produced by the circuit.

17. The circuit of claim 15, further comprising means for producing a load signal representative of an electrical loading on the circuit, wherein the means for setting the response characteristic of the first means uses the load signal in addition to the headroom signal.

* * * * *